United States Patent [19]
McMahon

[11] Patent Number: 4,707,061
[45] Date of Patent: Nov. 17, 1987

[54] OPTICAL COMMUNICATION SYSTEM EMPLOYING FREQUENCY REFERENCE

[75] Inventor: Donald H. McMahon, Carlisle, Mass.

[73] Assignee: Polaroid Corporation, Cambridge, Mass.

[21] Appl. No.: 783,436

[22] Filed: Oct. 3, 1985

[51] Int. Cl.⁴ .............................................. G02B 6/28
[52] U.S. Cl. ................................................. 350/96.16
[58] Field of Search ............... 350/96.13, 96.14, 96.15, 350/96.16; 455/610

[56] References Cited

U.S. PATENT DOCUMENTS 4,558,920 12/1985 Newton et al. .................. 350/96.16

Primary Examiner—William L. Sikes
Assistant Examiner—Robert E. Wise
Attorney, Agent, or Firm—Francis J. Cuafield

[57] ABSTRACT

An optical communications system with terminal devices connected to an optical pathway for communications with one another. A system wide reference signal is introduced into the optical pathway by a reference signal generator for propagation throughout the system. Each terminal device includes a resonant cavity to support one of a plurality of available sets of resonant modes, each set having an associated free spectral range between resonant modes, and controls the resonant cavity structure to lock one of the resonant modes of the resonant cavity to the system wide reference signal. The resonant characteristics of the resonant cavity at each terminal device can be changed to vary the number of integral wavelengths supported in the resonant cavity. Plural terminal devices can communicate with one another to support a set of resonant modes common to one another with one mode of the common set locked to the system wide frequency reference.

31 Claims, 9 Drawing Figures

| SET | INTEGER WAVELENGTHS | FREE SPECTRAL RANGE (FSR) | Δ FSR (MHz) | $f_R$ | n | (n·FSR) | $f_C$ (MHz) |
|---|---|---|---|---|---|---|---|
| -1 | 30 001 | 9999.67 | -0.33 | $375 \times 10^3$ GHz | 300 | 2 999 901 MHz | 377 999 901 |
| 0 | 30 000 | 10000.00 | | $375 \times 10^3$ GHz | 300 | 3 000 000 MHz | 378 000 000 |
| +1 | 29 999 | 10000.33 | +0.33 | $375 \times 10^3$ GHz | 300 | 3 000 099 MHz | 378 000 099 |

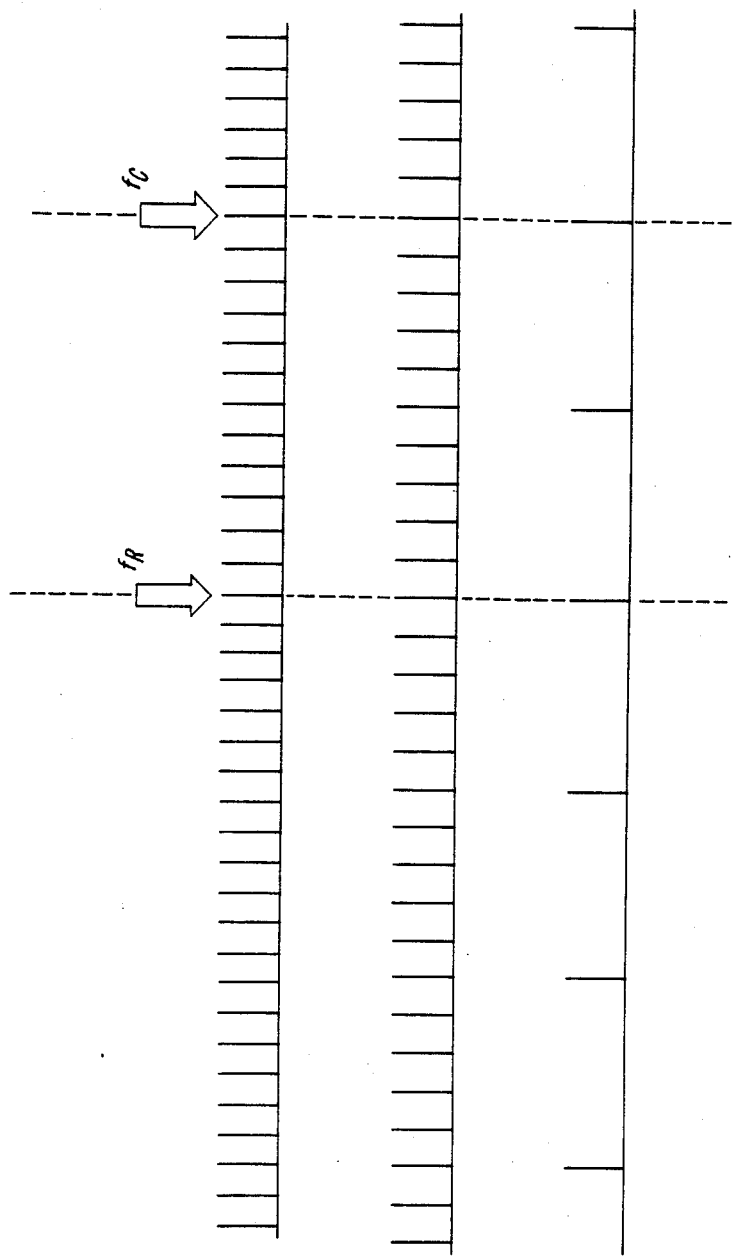

OPTICAL COMMUNICATION SYSTEM EMPLOYING FREQUENCY REFERENCE

BACKGROUND OF THE INVENTION

The present invention relates to communication systems. More particularly, it concerns optical communications systems in which a plurality of terminal devices communicate with one another over a common optical pathway using frequency distinct channels.

In the communications system art, it is known to create networks in which a frequency spectrum is divided into unique channels of assigned bandwidth and center frequency and in which terminal devices are coupled into a network bus with each terminal device having a controllable local oscillator which can be tuned to acquire any one of the available channels to establish communications. The local oscillators can be of the type that are tuned in a continuous manner across the spectrum from one channel center frequency to another or, more preferably, of the type that respond to a "tuning event" to shift frequency from one channel center frequency to another. This type of system functions well where the frequency of the local oscillator source at each terminal device can be accurately controlled. In the radio frequency spectrum, inexpensive and stable oscillator sources which can be tuned over a wide frequency range, in either a continuously variable manner or in a step-wise channel-by-channel manner, are readily available. In the optical spectrum, however, stable oscillator sources which can be tuned over a wide range are generally not available. While inherently stable, fixed frequency devices are available in the form of gas lasers, such as the He—Ne laser, the use of gas lasers as frequency reference sources for the terminal devices is considered too expensive to allow implementation of networks on a large scale. While semiconductor lasers are available as local frequency sources in the optical spectrum, these devices are susceptible to both short and long term frequency variations as a function of temperature, drive current, and optical feedback and thus limit the ultimate channel density that can be achieved for a given spectrum.

Accordingly, a need exists for a communications system operating in the optical spectrum in which each terminal device in the system can acquire any available channel in a reliable and repeatable manner using inexpensive and stable frequency sources.

SUMMARY OF THE INVENTION

In view of the above, the present invention provides an optical communications system in which an optical pathway is provided to which terminal devices are connected for communications with one another. A system wide reference signal is introduced into the optical pathway by a reference signal generator for propagation throughout the system. Each terminal device within the system includes a resonant cavity structure and a controller which controls the resonant cavity structure to support a selected one of a plurality of available sets of resonant modes, each set of resonant modes having an associated free spectral range between resonant modes, and also controls the resonant cavity structure to lock one of the resonant modes of the resonant cavity to the system wide reference signal. The resonant characteristics of the resonant cavity structure at each terminal device can be changed to vary the number of integral wavelengths supported in the resonant cavity structure, that is, to support a different set of resonant modes having a larger or smaller free spectral range, while still locking one of the resonant modes to the system wide reference signal. Accordingly, two or more terminal devices can communicate with one another by changing the resonant characteristics of their respective resonant cavity structures to support a set of resonant modes common to one another with one mode of the common set locked to the system wide frequency reference. Since one mode of the common set of resonant modes is locked to the same system wide reference signal, the corresponding resonant modes supported in each commonly tuned resonant cavity will be of the same frequency. Signal transmission can be accomplished by introducing an information bearing light signal into the resonant cavity at a frequency that corresponds to one mode of the supported set of resonant modes for introduction into the optical bus. The resonant cavity structures of other terminal devices tuned to the common set of resonant modes will preferentially support the light signals introduced by the transmitting terminal device for subsequent information recovery. For a terminal device to communicate at another frequency, the resonant cavity structure is controlled to support a different set of resonant modes having a different free spectral range while maintaining one mode of the new set of resonant modes locked to the system wide reference frequency. Since the free spectral range of the new set of resonant modes will be smaller where a greater number of integral wavelengths are supported or larger where a fewer number of integral wavelengths are supported, the frequency of the resonant mode used for communication of the new set will be shifted from that of the former set to provide a wavelength-shifted communications frequency.

The resonant cavity structure is preferably one that can be physically perturbed in a repeatable step-wise manner, for example, by thermal excitation, to support a different set of resonant modes having a correspondingly different free spectral range with each step-wise perturbation. Step-wise perturbations of the resonant cavity structure allows repeatable and accurate channel-by-channel tuning without overly complex frequency control arrangements or the use of local frequency references at each terminal device.

In the preferred embodiment, the system is defined as a closed loop optical bus into which the system wide reference signal generator introduces a fixed frequency reference signal for utilization by the terminal devices. The system wide frequency reference includes a highly stable frequency source, such as a stabilized He—Ne gas laser, which introduces light energy into a controllable resonant cavity structure in the form of a Fabry Perot resonator. A piezoelectric transducer is coupled to the Fabry Perot resonator and controls the resonant characteristics thereof by altering a physical property of the resonator. A feedback loop measures the output of the Fabry Perot resonator and compares the output to a phase reference signal to provide a drive signal to the piezoelectric transducer to control the Fabry Perot resonator in such a way that one of its resonant modes is locked to the output frequency of the gas laser and thereby fix the frequency of the other resonant modes supported in the Fabry Perot resonator. A semiconductor laser diode operating in the desired infrared portion of the optical spectrum (e.g., 0.75 to 1.5 microns) also introduces light energy into the frequency stabilized Fabry Perot resonator with the infrared output introduced into another control loop that controls and stabilizes the output of the semiconductor laser diode relative to another resonant mode in the desired infrared portion of the optical spectrum to provide a highly accurate and stable offset between the frequency of the gas laser and the controlled semiconductor laser. Additionally, an AC dither component is provided to cause the system wide reference signal to dither about its average frequency value. The stabilized output of the semiconductor laser is introduced into the optical bus for propagation throughout the system and utilization by the various terminal devices coupled to the optical bus.

Each terminal device in the network includes a thermally controllable bus tap resonator having a resonant cavity loop coupled to the system bus. The resonant loop can support different sets of resonant modes (that is, different numbers of integral wavelengths) with corresponding free spectral ranges including resonant modes in the vicinity of the frequency of the system wide reference frequency and resonant modes in the vicinity of the desired communications frequencies. The resonant loop can thus be controlled at a first temperature to support a first set of resonant modes including a resonant mode at the frequency of the system wide reference signal and another communications resonant mode that is n free spectral ranges removed from the system wide reference resonant mode and accordingly defined at a first absolute communications frequency. In order to change communications frequencies, the resonant loop is subjected to a predetermined step-wise thermal perturbation to, for example, reduce the effective optical length and the integer number of wavelength supported in the resonant loop to thus reduce the number of supported resonant modes and correspondingly increase the free spectral range. As a result, a resonant mode n free spectral ranges removed from the resonant mode that is locked to the system wide reference signal occurs at a second communications frequency that is higher than the first frequency. The separation in frequency between the nth resonant modes of the first and second sets can be controlled by controlling the value of n and the change in free spectral range between the first and second or subsequent sets of resonant modes. Since the resonant loop is perturbed thermally in a repeatable step-wise manner, the absolute frequency of the nth resonant mode can likewise be controlled in a step-wise channel-by-channel manner.

In order to effect communications, a semiconductor laser, controlled by varying its drive current and its operating temperature, introduces modulated light energy into the resonant cavity loop at a frequency corresponding to that of one of the supported resonant modes selected for communication for introduction into the optical bus and propagation to other terminal devices. Any two terminal devices in the network may communicate by thermally altering their respective resonant loops to resonantly support a common set of resonant modes with one mode locked to the system wide reference signal to thus fix the frequency of the other resonant modes in the common set including the resonant modes over which communications takes place. The receiving terminal devices, by supporting a common set of resonant modes with the one mode locked to the system wide reference signal will also preferentially support light signals introduced by other terminal devices at a frequency corresponding to the common selected resonant mode.

A second resonant cavity loop may be provided in each terminal device and controlled to support a different set of resonant modes from that supported by the first resonant cavity with a selected resonant mode supported in common to provide an additional measure of resonant mode selection and increased free spectral range.

A principal objective of the present invention is, therefore, the provision of an improved optical fiber communications system by which various terminal devices within the system may readily communicate with one another using accurately defined frequencies. Other objects and further scope of applicability of the present invention will become apparent from the detailed description to follow, taken in conjunction with the accompanying drawings, in which like parts are designated by like reference characters.

DESCRIPTION OF THE DRAWINGS

FIG. 4a is a partial graphical representation of first, second, and third sets of resonant modes of a resonant cavity maintained at corresponding first, second, and third temperatures;

FIG. 4b is a table of quantitative values relating to the first, second, and third sets of resonant modes presented in FIG. 4a;

FIGS. 6a, 6b, and 6c are a partial graphical representation of the resonant mode characteristics of the alternate terminal device of FIG. 5.

DESCRIPTION OF THE PREFERRED EMBODIMENT

Figure 1:
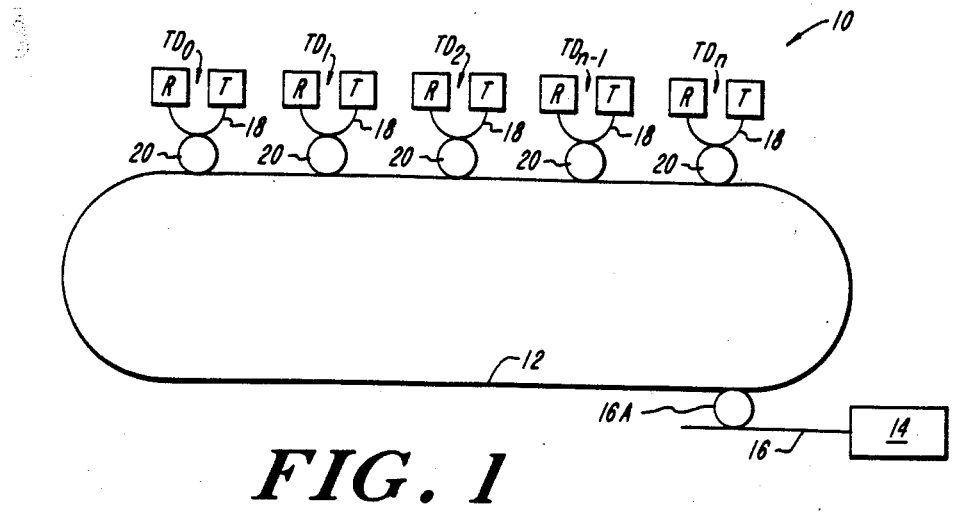
FIG. 1 is an overall schematic diagram of an optical fiber communications system in accordance with the present invention illustrating an optical ring topology with a system wide reference signal source and various terminal devices coupled into the optical bus.

An optical fiber communications system in accordance with the present invention is illustrated in schematic form in FIG. 1 and designated generally therein by the reference character 10. The communications system 10 is configured as a closed ring or loop defined by a single mode optical fiber bus 12. The communications system includes a system wide reference signal source 14 coupled into the optical fiber bus 12 through a coupling link 16 and a plurality of terminal devices $TD_0$, $TD_1$, $TD_2$, $TD_{n-1}$, $TD_n$ which are coupled to the optical fiber bus 12 for communications with one another. Each terminal device TD can include separate receive and transmit devices, R and T, connected through an optical fiber coupling link 18 which, in turn, is coupled through a bus tap resonator 20 to the optical fiber bus 12. While each terminal device TD can include both receive and transmit devices, R and T, for duplex communications with one another, selected of the terminal devices TD can include only a receive device R or a transmit device T to provide single function terminal devices. The system wide reference signal source 14, as explained in further detail below, is effective to introduce a fixed wavelength optical signal onto the optical fiber bus 12 through the optical coupling link 16 and a resonant loop coupler 16A. The resonant loop coupler 16A selectively passes the system wide reference source into the loop and prevents communication frequency signals from passing from the loop at the tap of the system wide reference signal source. The various terminal devices TD throughout the system utilize the system wide reference signal, as explained in more detail below, to control their respective bus tap resonator 20 to distinguish between available communications channels.

Figure 2:
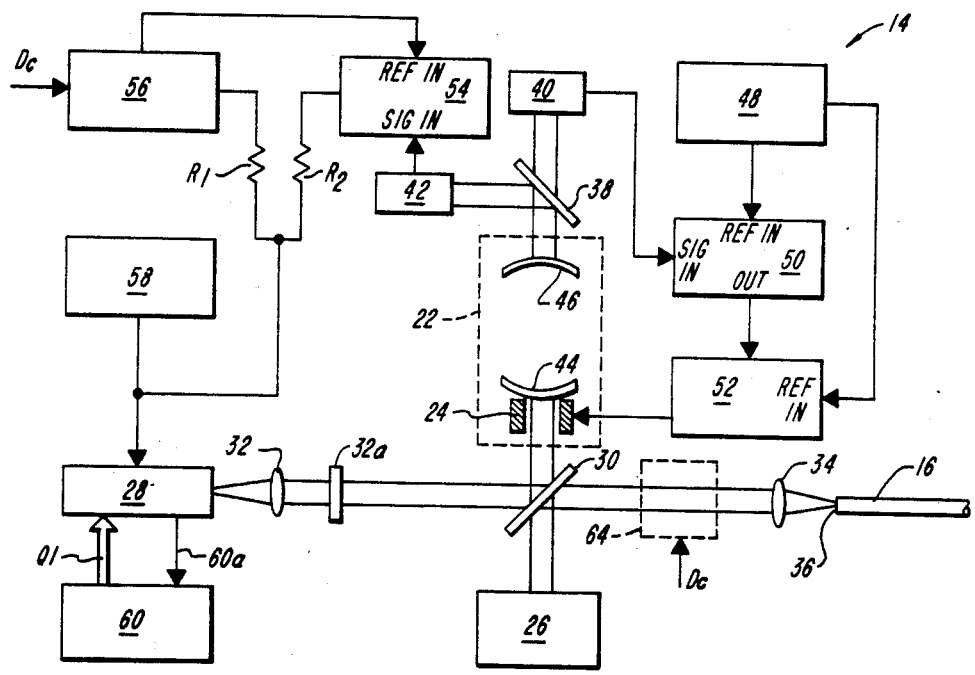
FIG. 2 is a schematic block diagram of an optical signal generator for generating a system wide reference signal for use in the system of FIG. 1.

The system wide reference signal source 14 is shown in schematic block form in FIG. 2 and functions to generate a frequency stable light output at a predetermined frequency or wavelength by using the stable output of a gas laser to stabilize a controllable resonant cavity structure and then using the stabilized resonant cavity structure, in turn, to stabilize the output of a semiconductor laser diode operating in the infrared portion of the optical spectrum. As shown in FIG. 2, the system wide reference signal source 14 includes a controllable resonant cavity structure 22 having resonant characteristics that are controlled by an electrically driven piezoelectric transducer 24. The transducer 24 can, for example, physically stress the resonant cavity structure 22 to alter its resonant characteristics. The resonant cavity structure 22 receives light energy from both a frequency stabilized He—Ne gas laser 26 and a semiconductor laser diode 28. The light output of the He—Ne gas laser 26 (viz., 632.8 nm) is transmitted through a beam splitter 30 into the resonant cavity structure 22 while the light output of the semiconductor laser diode 28 is directed through an objective lens 32 and an optical isolator 32a and reflected, in part, by the beam splitter 30 into the resonant cavity structure 22 with the remaining portion of the light output of the semiconductor laser diode 28 transmitted through the beam splitter 30 and a lens 34 into the input port 36 of the optical coupling link 16 for introduction into the optical fiber bus 12 (FIG. 1). The optical isolator 32a, for example, a quarter wave plate, neutral density filter, magnetic isolator, or acousto-optic modulator used as an isolator, is inserted into the optical path at the output of the laser diode 28 to avoid optical feedback from any other components in the system.

The light energy exiting the resonant cavity structure 22 is directed to a color separation beam splitter 38, which can take the form of an interference filter, which is effective to filter or separate the light output of the resonant cavity structure 22 into light energy of predetermined bands. In the case of the preferred embodiment, the color separation beam splitter 38 functions to transmit light in the red portion of the optical spectrum, that is, corresponding to the red light output of the He—Ne laser 26, and reflect light in the infrared portion, that is, corresponding to the output of the laser diode 28. A detector 40, which detects light in the red portion of the optical spectrum, is positioned to receive the light transmitted through the color separation beam splitter 38 and provides a corresponding electrical output. In a similar manner, an infrared detector 42 is positioned to receive the infrared energy reflected from the color separation beam splitter 38 and provides a corresponding electrical output. As described more fully below, the output of the detector 40 is used as a control signal in a feedback loop to control the resonant characteristics of the controllable resonant cavity structure 22 to correspond to the output of the He—Ne laser 26, and, in a similar manner, the output of the infrared detector 42 is used as a control signal in another feedback loop to control the frequency of the output of the semiconductor laser diode 28 to correspond with one of the resonant modes of the controllable resonant cavity structure 22.

The resonant cavity structure 22 is preferably defined as a Fabry Perot cavity having a transmission media bounded by spaced confocal reflectors 44 and 46. The piezoelectric transducer 24 is physically coupled to the resonant cavity structure 22 so that electrical stimulation of the piezoelectric transducer 24 will alter one or more physical properties of the cavity in order to change the effective optical length of the cavity and, accordingly, its resonant characteristics. As is known, the resonant cavity structure 22 will preferentially support optical energy at wavelengths that are an integral number of half wavelengths of the effective optical length of the cavity to define a set of wavelength spaced resonant lines or modes. Electrical stimulation of the piezoelectric transducer 24 will alter the effective optical length of the cavity to thus alter its resonant characteristics and change the number and spacing of resonant modes that will be supported within the cavity.

The intensity of the light entering the detector 40 is a function of the intensity of the light emitted by the He—Ne laser 26 and the resonant characteristics of the resonant cavity structure 22. Thus, where one resonant mode of the resonant cavity 22 is identical to the wavelength of light emitted by the He—Ne laser 26, the intensity of the light and the electrical output of the detector 40 will be a maximum. Conversely, the intensity of the light entering the detector 40 and the electrical output of the detector 40 will be less than a maximum where none of the resonant modes supported in the resonant cavity 22 are coincident in wavelength with that of the He—Ne laser 26.

The electrical output of the detector 40 is presented to a feedback loop which includes a sinusoidal dither voltage source 48, a phase sensitive amplifier 50, and a piezoelectric driver 52. The output of the detector 40 is presented to the SIG IN input of the phase sensitive amplifier 50, and the output of the sinusoidal dither source 48 is presented to a reference input REF IN of the phase sensitive amplifier 50. The output of the sinusoidal dither source 48 varies in a periodic manner at a relatively low frequency to desirably provide center frequency locking, as described below. The phase of the SIG IN and REF IN inputs is compared by the phase sensitive amplifier 50 to provide a voltage output signal to the piezoelectric transducer driver 52, which also includes a REF IN input for receiving the sinusoidal dither voltage output from the sinusoidal dither source 48.

The output of the piezoelectric transducer driver 52 is an appropriately scaled voltage which drives the piezoelectric transducer 24 to alter the resonant characteristics of the cavity 22 in such a way that one resonant mode corresponds to and supports the 632.8 nm frequency of the He—Ne laser 26. Since a dither component is present on the drive signal from the piezoelectric transducer driver 52, the resonant cavity structure 22 will be center locked onto the frequency of the output of the He—Ne laser 26 as distinguished from locking to one side or the other of the frequency of the He—Ne laser 26. Thus, one resonant mode of the resonant cavity structure 22 is continuously locked to the 632.8 nm frequency of the light output of the frequency stabilized He—Ne laser source 26 and all other resonant modes supported in the resonant cavity structure are defined in the frequency spectrum relative to the one resonant mode locked to the output of the He—Ne laser source 26.

The laser diode 28 presents its light output through the lens 32 and the optical isolator 32a to the beam splitter 30 with a major portion of the energy transmitted through the beam splitter and the lens 34 into the input port 36 of the optical link fiber 16. The frequency of the light output of the laser diode 26 is typically in the infrared region of the optical spectrum, that is, 0.75-1.5 microns. A portion of the light output of the laser diode 28 is reflected by the beam splitter 30 into and through the frequency stabilized resonant cavity 22 to the color separating beam splitter 38 and into the infrared detector 42. While a resonant mode of the resonant cavity structure 22 is nominally locked to the output of the frequency stabilized He—Ne laser 26, as described above, the cavity structure 22 will support many resonant modes that are an integral number of half wavelengths of the effective optical length of the cavity, including resonant modes in the infrared region of the optical spectrum. The electrical output of the infrared detector 42 will be at a maxima where the frequency of the laser diode 28 corresponds to one of the resonant modes of the cavity 22, and, conversely, the output will be less than a maximum when the frequency of the laser diode 28 does not correspond to one of the resonant modes of the cavity.

The output of the infrared detector 42 is provided to a feedback loop which includes a phase sensitive amplifier 54, a sinusoidal dithering voltage source 56 responsive to a dither control signal $D_c$, a laser diode current source 58, and a laser diode temperature controller 60. The output of the infrared detector 42 is presented to a signal input SIG IN of the phase sensitive amplifier 54 which also receives a reference signal REF IN from the sinusoidal dither voltage source 56. The output of the phase sensitive amplifier 54 is combined with that of the sinusoidal dither voltage source 56 through resistors R1 and R2 with the combined values connected to the output of the laser diode current supply 58. The laser diode current supply 58 functions to provide a base level drive current to the laser diode 28 to drive it into oscillation while the combined outputs of the sinusoidal dither voltage source 56 and the phase sensitive amplifier 54 function to alter the drive current level in such a way as to alter the frequency of the laser diode 28 to correspond to a resonant mode of the resonant cavity structure 22. Accordingly, the drive current of the laser diode 28 will be varied in such a way to cause the laser diode output frequency to lock to the center of a resonant mode of the resonant cavity structure 22. Since the drive current is dithered in response to the sinusoidal dither source 56, the frequency of the light output of the laser diode 28 will be center locked to a resonant mode of the resonant cavity structure 22, as distinguished from side locked. The laser diode temperature controller 60 provides temperature stabilization of the laser diode 28 to eliminate a possible error source. The temperature of the laser diode 28 is sensed by the laser diode temperature controller 60 along control path 60a and the quantity of heat presented along thermal path Q1 is varied to provide constant temperature operation.

As described below, a resonant mode of the bus tap resonator 20 associated with each terminal device TD is center locked to the system wide reference signal. In order to achieve center locking, an A.C. signal or other excitation is applied to the laser diode 28 to cause the output wavelength to dither about its average stabilized wavelength. While the output of the laser diode 28 can be dithered in a number of ways, it is preferred that an A.C. signal source 56 directly vary the drive current to the semiconductor laser 28 in response to the dither control signal $D_C$.

It is also desirable, as described below, to provide phase reference information on the system wide reference signal for the purpose of controlling the terminal devices TD. To this end, a modulator 64 (broken line illustration), such as an acousto-optical cell, is placed in the optical path between beam splitter 30 and the lens 34 to intensity modulate the output of laser diode 28 prior to introduction into the coupling link 16. The modulator 64 varies the amplitude of the laser diode 26 output in response to the dither control signal $D_C$ to allow phase decoding at the various terminal devices TD.

The laser diode 28 is thus stabilized in the infrared region to one of the resonant modes of the resonant cavity structure 22 which, in turn, is stabilized to the output of the He—Ne laser 26 to provide a stable system wide frequency reference signal for the optical fiber communications system 10 (FIG. 1).

Figure 3:
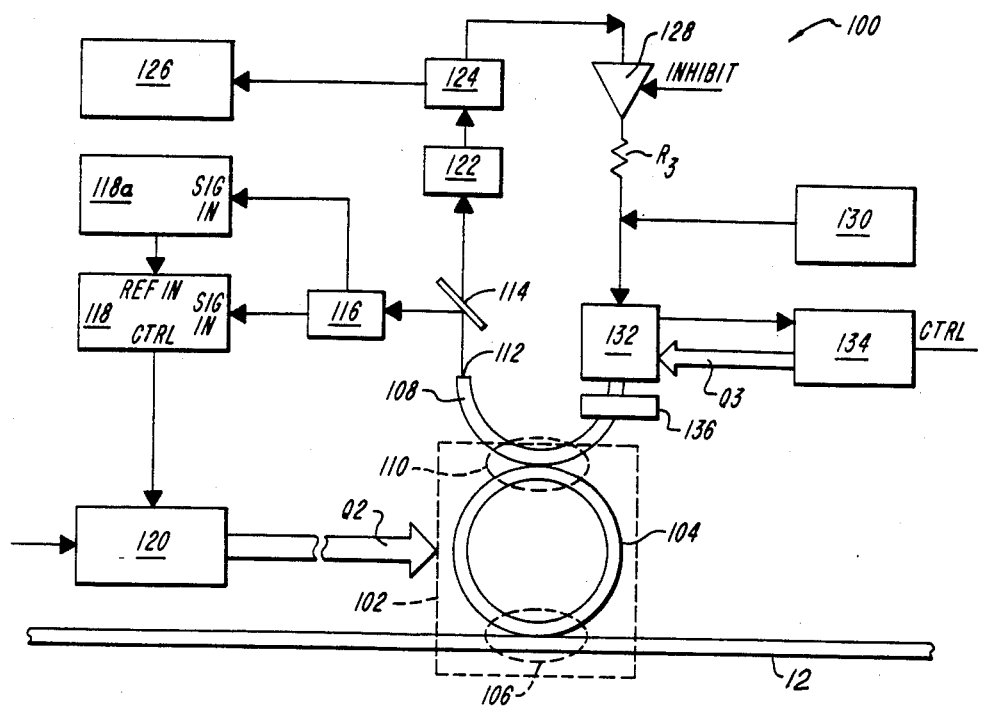
FIG. 3 is a schematic block diagram of an exemplary terminal device in accordance with the present invention.

An exemplary terminal device TD in accordance with the present invention is illustrated in FIG. 3 and designated generally therein by the reference character 100. The terminal device 100 is coupled to the optical fiber bus 12 for communication with other terminal devices TD. The terminal device 100 includes a bus tap resonator 102 which has a resonant cavity loop 104 coupled to the optical fiber bus 12 through a lateral coupling 106. The bus tap resonator 102 is preferably maintained in a thermally insulated housing (not shown) to allow thermal tuning, as explained more fully below. Aside from fabrication directly from fiber, the bus tap resonator 102 may be formed, for example, by doping selected paths in a substrate with index of refraction altering materials to define the resonant cavity loop 104. The resonant cavity loop 104 will preferentially support wavelengths which are an integral number of wavelengths of the effective optical length of the resonant cavity loop 104, that is, a set of resonant modes which, as explained below, will include a resonant mode corresponding in frequency to that of the system wide reference signal and other resonant modes at frequencies usable for commu- nications.

An optical coupling link 108 is coupled to the resonant cavity loop 104 through a lateral coupling 110 and functions to remove a portion of the system wide reference signal present in the resonant cavity loop 104 for bus tap resonator 102 stabilization purposes as well as for removing and introducing information bearing signals into the resonant cavity loop 104. Light energy removed from the resonant cavity loop 104 through the lateral coupling 110 is directed through an output port 112 to a partially transmitting/ partially reflecting interference filter 114 which may be, for example, a multilayer dielectric interference filter. The interference filter 114 separates the system wide reference signal and any information bearing signals and provides the system wide reference signal component to a control loop which thermally controls the resonant characteristics of the bus tap resonator 102, this control loop including the interference filter 114, a reference signal detector 116, a phase sensitive amplifier 118, a phase reference decoder 118a, and a temperature controller 120 in a heat conducting relationship through thermal path Q2 with the bus tap resonator 102. As shown in FIG. 3, the interference filter 114 reflects the system wide reference signal component into the reference signal detector 116 which provides an amplitude varying electrical signal to the SIG IN inputs of the phase sensitive amplifier 118 and the phase reference decoder 118a. As mentioned above, the system wide reference signal is frequency dithered in a periodic manner about its desired average frequency value and, additionally, is amplitude modulated in timed relationship with the frequency dithering in accordance with the dither control signal $D_C$. The reference signal detector 116 provides an electrical output, which varies in a manner responsive to the frequency dither variation of the system reference signal, to the SIG IN input of the phase sensitive amplifier 118 and another electrical output, which varies in a manner responsive to the frequency dither related amplitude component of the system reference signal, to the SIG IN input of the phase decoder 118a. A phase reference signal is provided from the phase decoder 118a to the REF IN input of the phase sensitive amplifier 118 which functions to provide a control output CTRL in the form of a D.C. level to the temperature controller 120. Thermal energy from the temperature controller 120 is presented along thermal path Q2 to the bus tap resonator 102 to alter its physical characteristics in such a way that its resonant characteristics are modified to tune to and remain tuned to the wavelength of the system wide reference signal. Accordingly, the bus tap resonator 102 will preferentially support wavelengths which are an integral number of wavelengths of the effective optical length of the thermally controlled bus tap resonator 102, these wavelengths defining a set of resonant lines or modes, one of which is tuned to the frequency of the system wide reference signal as described.

The interference filter 114 serves to transmit information bearing signals exiting the output port 112 to a signal detector 122 which provides an electrical output to a multi-position transmit/receive switch 124. A wideband receiver 126 is coupled to the transmit/receive switch 124 and serves to demodulate any information bearing signals provided from the signal detector 122 through the transmit/receive switch 124. In addition to providing the output of the signal detector 122 to the wideband receiver 126, the transmit/receive switch 124 can also provide the output of the signal detector 122 to a stabilized laser diode control loop which includes a feedback amplifier 128, a resistor R3, a current source 130, a laser diode 132, and a thermal laser diode frequency controller 134 which presents thermal energy to the laser diode 132 along a path Q3.

When the terminal device 100 is operating as a transmitter, the laser diode 132 operates to provide light energy to the optical coupling link 108 at a frequency which corresponds to the frequency of one of the available resonant modes in the thermally controlled bus tap resonator 102. The current source 130 functions to provide drive current for the laser diode 132 while the operating frequency is controlled by the thermal controller 134. The portion of the light output of the laser diode 132 not transferred through the resonant cavity loop 104 to the optical fiber bus 12 exits the output port 112 of the optical coupling link 108 and is transmitted through the interference filter 114 to the signal detector 122. The output of the signal detector 122 is presented to the feedback amplifier 128 which provides an amplified output that combines through resistor R3 with the drive current provided by the current source 130 to vary the drive current of the laser diode 132 in such a way that its output is frequency stable.

The laser diode 132 can be frequency stabilized using the output of the optical coupling link 108 since the energy transferred through the lateral coupling 110 will be a maximum when the wavelength of the laser diode 132 output corresponds to an existing resonant mode, and the residual energy emerging from the output port 112 will be a corresponding minima. When the frequency of the laser diode output changes, less energy will be transferred through the lateral coupling 110 to the resonant cavity loop 104 and commensurately more energy will exit the output port 112 of the optical coupling link 108. As can be appreciated, this variation in the energy appearing at the output port 112 is detected by the signal detector 122 and used to accurately stabilize the frequency of the output of the laser diode 132 to one of the available resonant modes in the resonant cavity loop 104.

The wavelength of the laser diode 132 output can be tuned from one resonant mode of the resonant cavity loop 104 to another by thermally controlling its physical characteristics using the thermal controller 134. Thus, when it is desired to tune to an adjacent resonant mode, the amount of thermal energy introduced into the laser diode 132 along the path Q3 by the thermal controller 134 can be increased or decreased to change the resonant characteristics of the laser diode 132 and, of course, the frequency of its output. As the frequency of the laser diode 132 is altered, the frequency will no longer correspond to that of a presently tuned resonant mode and the amount of light transferred through the lateral coupling 110 in the resonant cavity 104 will diminish with commensurately more residual light presented through the output port 112 to the signal detector 122. The feedback amplifier 128 will attempt to control the frequency of the laser diode 132 by altering the drive current in an effort to vary the output wavelength of the laser diode 132 in the direction of the resonant mode.

In normal operation, the feedback amplifier 128 and thermal controller 134 control the frequency of the laser diode 132 to follow or track the frequency of a particular resonant mode. If desired, the laser diode 132 can be controlled to track another resonant mode by inhibiting the amplifier 128 through an INHIBIT signal and controlling the thermal controller 134 to increase or decrease the operating temperature and the laser diode 132 operating frequency to correspond to the frequency of another resonant mode, after which the feedback amplifier 128 can be enabled.

Two or more terminal devices TD can communicate with one another by thermally controlling their respective bus tap resonators 102 to support the same set of resonant lines or modes, that is, the same integral number of wavelengths. When the bus tap resonators 102 of the communicating terminal devices TD are so tuned, each bus tap resonator 102 will support an equal number of resonant modes at corresponding frequencies and with the same free spectral range (FSR) between resonant modes. As described above, the reference signal detector 116, the phase sensitive amplifier 118, and the phase information decoder 118a will control the temperature controller 120 of the respective terminal devices TD to lock a common resonant mode, designated herein as the R mode, in each bus tap resonator 102 to the system wide frequency reference signal at a frequency $f_R$ and thus establish the wavelength of all remaining resonant modes of the supported set of resonant modes. The laser diode temperature controller 134 of a transmitting terminal device $TD_T$ controls the wavelength of the laser diode 132 to lock onto one of the available resonant modes, designated herein as the C mode at a frequency $f_c$, of the set of supported resonant modes for communications purposes. Of course, the transmitting terminal device $TD_T$ can not lock onto the same resonant mode as that of the system wide reference signal (viz., the R mode) and preferably locks onto a resonant mode sufficiently spaced from that of the system wide reference signal to allow effective separation of the system wide reference signal and communications signal by the interference filter 114 at a receiving terminal device $TD_R$. Since the receiving terminal device $TD_R$ supports the same resonant modes as those supported by the transmitting terminal device $TD_T$, any light signals propagated in the optical fiber bus 12 corresponding in frequency to a supported resonant mode will be coupled from the optical fiber bus 12 through the lateral coupling 106 into the resonant cavity loop 104 of the receiving terminal device $TD_R$ for demodulation and information content recovery. Since a receiving terminal device $TD_R$ will support many resonant modes, it is possible for a receiving terminal device to respond to information bearing signals provided from two or more transmitting terminal devices $TD_{T1}$ and $TD_{T2}$ using different resonant modes.

Figures 4A, 4B:
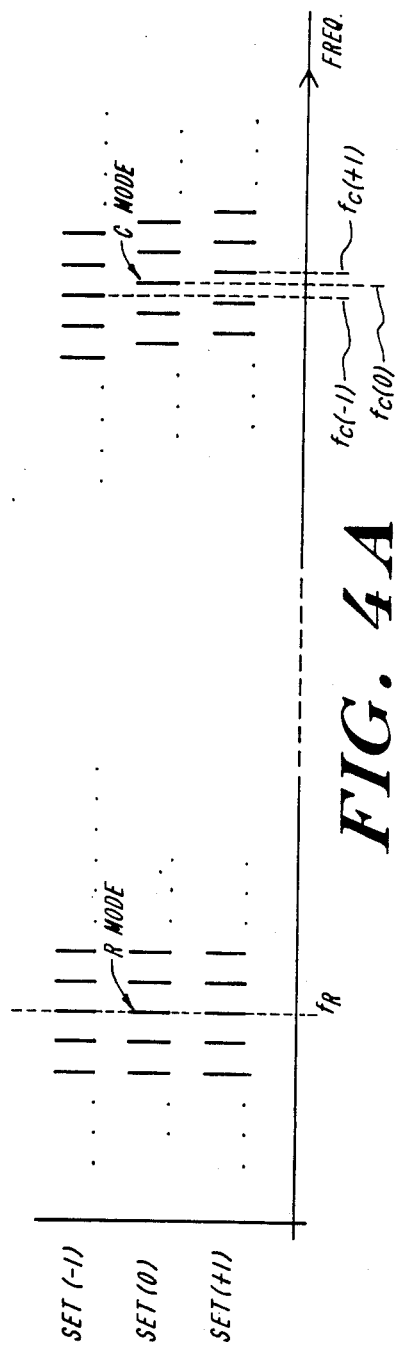

Any terminal device TD or group of terminal devices in the system can select a particular communications frequency $f_c$ by providing a step-wise change in the operating temperature of the respective bus tap resonator 102 sufficient to support a greater or lesser number of resonant modes in the resonant cavity loop 104 and thus decrease or increase the free spectral range of the different sets of resonant modes. FIG. 4a illustrates graphically the manner by which the bus tap resonator 102 can be controlled to provide different frequency-distinct communication channels in response to step-wise changes in the operating temperature of the bus tap resonator 102. In FIG. 4a, three sets of resonant modes, SET(−1), SET(0), and SET(+1) are presented with SET(0) representing the resonant modes supported in the bus tap resonator 102 at an initial temperature $T_0$, SET(−1) respresenting the resonant modes supported at a temperature $T_0+\Delta T$, and SET(+1) representing the resonant modes supported at a temperature $T_0-\Delta T$. In practice, a $\Delta T$ sufficient to change the number of integral wavelengths supported in the bus tap resonator 102 for a resonator having a 2 cm. physical path length and an index of refraction of 1.5 (a 3.0 cm. effective optical path length) is between 1 and 5 degrees centigrade. In FIG. 4a, the group of resonant modes at frequencies in the vicinity of the frequency of the system wide reference signal are shown as vertical lines with one mode designated as the R mode, that is, the reference mode at a frequency $f_R$ corresponding to the frequency of the system wide reference signal provided by the reference signal source shown in FIG. 2 and described above. A group of resonant modes at frequencies in the vicinity of the communications frequency are also shown as vertical lines with one mode designated as the C mode, that is, the communications mode at a frequency $f_C$. Additionally, the resonant modes of all three sets are shown with an intermode spacing that represents the free spectral range (FSR), which FSR is different for each set of resonant modes. As can be appreciated by those skilled in the art, only a few of the many resonant modes present in a bus tap resonator 102 operating at optical frequencies can be illustrated in FIG. 4a. In general, the C mode is selected at a frequency that is spaced from the frequency of the R mode by n free spectral ranges, where n=300 in the case of the present example.

As represented by the SET(0) in FIG. 4a, the bus tap resonator 102 at an initial temperature $T_0$ will support an integer number of wavelengths, with the R mode locked to the system wide reference signal frequency $f_R$. Accordingly, the free spectral range between modes and the frequency of all the remaining resonant modes will be known depending upon the number of resonant modes that are removed from the R mode. Thus, the frequency of the C mode (removed 300 spectral ranges from the R mode), can be determined as $f_C=f_R+(300 \times FSR)$. In order for a terminal device TD to tune to another communications frequency $f_C$, its bus tap resonator 102 is subjected to a step-wise change in operating temperature by an amount $\Delta T$ to increase or decrease the number of resonant modes supported in the resonant loop 104 and thus decrease or increase the free spectral range and the frequency of all the remaining resonant modes, includes the C mode. As illustrated by the SET(−1) in FIG. 4a, the bus tap resonator 102 can be subjected to a step-wise increase in temperature to a new temperature $T=T_0+\Delta T$ to increase the effective optical length and increase by one the number of integral wavelengths supported in the resonant loop 104 and the number of corresponding resonant modes. As can be appreciated, an increase in the number of resonant modes within the resonant cavity loop 104 decreases the intermode free spectral range. Thus, the frequency of the C mode can be determined by the number of modes removed from the R mode multiplied by the decreased free spectral range. As shown in FIG. 4a, the C mode assumes a new communications frequency $f_{C(-1)}$. Conversely, the communications frequency of the C mode can be increased, as represented by the SET(+1) by decreasing the temperature of the bus tap resonator 102 to a temperature $T=T_0-\Delta T$ to shorten the effective optical length of the resonant cavity loop 104 and support one fewer integer wavelengths and resonant modes with an increased free spectral range. The frequency of all resonant modes in the SET(+1) can thus be determined by the free spectral range and the number of modes that are removed from the R mode. Accordingly, the frequency $f_{C(+1)}$ of the C mode in the SET(+1) is determined by the value of n (300) multiplied by the somewhat larger free spectral range and, as shown in FIG. 4a, the frequency $f_{C(+1)}$ is somewhat higher than that for either the SET(0) or the SET(−1).

Accordingly, a step-wise increase or decrease of the operating temperature of the bus tap resonator 102 to support a greater or lesser number of integral wavelengths changes the number of resonant modes supported in the resonant loop 104 and change the intermode free spectral range to provide corresponding step-wise changes in the frequency $f_C$ of the C mode used for communications.

The table of FIG. 4b indicates, in a quantitative manner, the changes in frequency of the C mode that can be obtained by changing the operating temperature of the bus tap resonator 102 in a manner sufficient to change the number of integral wavelengths and resonant modes supported within the resonant cavity loop 104. In FIG. 4b, SET(0) is defined as having 30,000 integer wavelengths. This condition can occur at one micron for a resonant cavity loop having the physical parameters presented above. In supporting 30,000 integer wavelengths of optical energy, the resonant modes are spaced by a free spectral range of 10,000 MHz. In this example, the reference frequency is defined as $375 \times 10^3$ GHz and the C mode is defined as n free spectral ranges removed from the R mode where n is equal to 300. Thus, in case of SET(0) the frequency of the C mode is offset from that of the R mode by $3.0 \times 10^6$ MHz to provide a C mode communications frequency $f_C$ of $378 \times 10^6$ MHz. In order to change the communications frequency from one frequency to another, for example, as indicated by the SET(−1) in FIG. 4b, the temperature of the bus tap resonator 102 is controlled in a stepwise manner to a new, higher temperature equal to $T_0 + \Delta T$ to increase the number of integer wavelengths in the resonant cavity by one to 30,001 and accordingly decrease the free spectral range to 9999.67 MHz (i.e., a decrease of 0.33 MHz). With the frequency of the system wide reference signal still fixed at $375 \times 10^3$ GHz, the difference in frequency between the R mode and the C mode is 2,999,901 MHz to now provide a new lower communications frequency $f_C$ of 377,999,901 MHz. In a converse manner, the temperature of the bus tap resonator 102 can be lowered to a new temperature $T_0 - \Delta T$ to provide, as indicated by the SET(+1) in FIG. 4b, one fewer integer wavelengths, that is, 29,999 wavelengths, in the resonant loop 104 with a corresponding increase in the free spectral range between resonant modes of 10,000.33 MHz (i.e., an increase of 0.33 MHz). With the system wide reference signal fixed at $375 \times 10^3$ GHz, the difference in frequency between the R mode and the C mode now becomes 3,000,099 MHz to provide a new communications frequency $f_{C(+1)}$ of 378,000,099 MHz.

Figure 5:
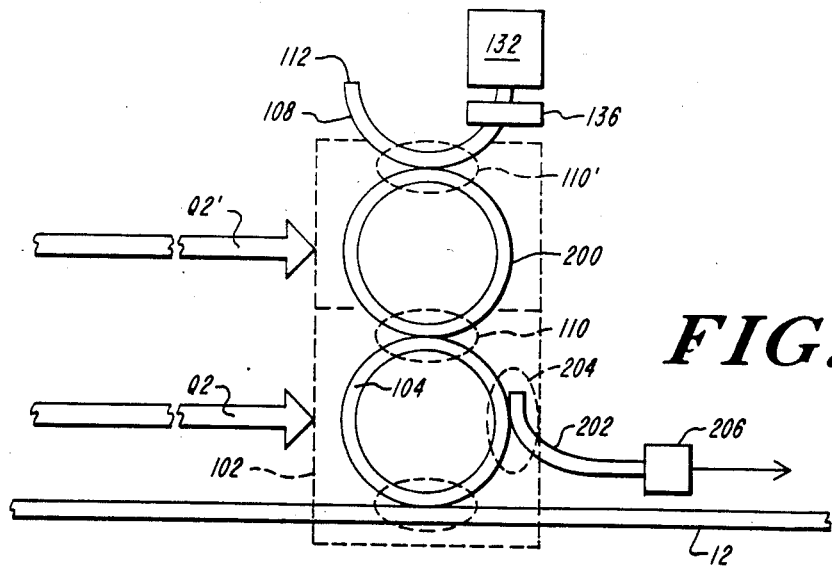
FIG. 5 is a partial schematic block diagram of an alternate terminal device in accordance with the present invention.

As can be appreciated, relatively discrete and finite changes in operating temperature, generally between 1 and 5 degrees centigrade, are effective to change the integer number of wavelengths in the resonant loop 104 in an accurate and repeatable manner to allow effective changes in the communications frequency $f_C$ in a step-wise manner.

Where a greater degree of selectively and increased free spectral range is desired in the selection of a particular resonant mode, for example, where a resonant mode is desired having a particular bandwidth relative to a resonant mode of another set of resonant modes, a second resonant cavity loop may be provided in the wavelength responsive optical circuitry of each terminal device TD. As shown in FIG. 5, a second resonant cavity loop 200 can be coupled to the resonant cavity loop 104 of the bus tap resonator 102 through the lateral coupling 110 and coupled to the optical coupling link 108 through another lateral coupling 110'. While not specifically shown in FIG. 5, the resonant cavity loop 200 is controlled in response to thermal energy provided along path Q2' from a thermal controller and related devices as described above.

A tap fiber 202 is laterally coupled to the resonant cavity loop 104 through a lateral couple 204 and presents its output to a detector 206. A control loop (not shown in FIG. 5) similar to that described above in the context of FIG. 3, uses the output of the detector 206 to control heat flow along path Q2 to the bus tap resonator 102. The resonant cavity loop 200 is configured or controlled to support a set of resonant modes different from that supported by the bus tap resonator 102 with one overlapping or coincident mode of each set of resonant modes locked to the system wide reference signal with any other overlapping or coincident modes used as a communications mode. By way of example and as illustrated in FIGS. 6a to 6c, the resonant cavity loop 200 can be configured to support the resonant modes presented in FIG. 6a, and the resonant cavity loop 104 can be controlled by its thermal controller to support a fewer number of resonant modes with each mode having a larger free spectral range as presented in FIG. 6b. One mode in each set of modes, such as the modes designated as $f_R$, is tuned to the system wide reference signal. Since the free spectral range is different between the coupled resonant cavity loops 200 and 104, selected resonant modes of both loops will periodically overlap, as illustrated in FIG. 6c, to provide fewer, more readily discernible resonant modes for communications purposes. A full disclosure of multi-cavity arrangements for tuning selected resonant modes is presented in commonly assigned U.S. patent application Ser. No. 625,543 filed June 28, 1984 by J. W. Hicks, Jr. and entitled OPTICAL RESONANT CAVITY FILTERS, the disclosure of which is incorporated herein to the extent necessary to practice the present invention.

In order to change from one communications frequency $f_C$ to another in the embodiment of FIG. 5, it is necessary that both resonant cavity loops 104 and 200 be controlled to support either the same additional number of integer wavelengths and corresponding resonant modes to effect a corresponding decrease in the free spectral range in each resonant cavity loop 104 and 200 and thus lower the communications frequency or the same lower number of integer wavelengths and corresponding resonant modes to increase the free spectral range in each resonant cavity loop 104 and 200 and thus increase the communications frequency $f_C$, to each resonant loop.

In the embodiment described above, the frequency of the system wide reference signal is dithered about an average value, that is, varied above and below the average value, to allow tuning and center locking of the various bus tap resonators 102 throughout the system to the reference signal. In order for each terminal device TD to achieve center locking it is necessary to provide phase variation information to each terminal device to be used as a phase reference signal for the phase reference amplifier of each terminal device. In the preferred embodiment, the system wide reference signal is amplitude modulated by a modulator 64 (FIG. 2) in a fixed time relationship with the frequency variation of the system wide reference signal. The reference signal detector 116 (FIG. 3) of each terminal device TD, in cooperation with the associated phase information decoder 118a, decodes the amplitude modulated component of the system wide reference signal to provide a phase reference signal to the REF IN input of the phase sensitive amplifier 118. Accordingly, the phase sensitive amplifier 118 can provide a control CTRL signal of appropriate polarity and scale to the temperature controller 120 to center lock the bus tap resonator 102 to the system wide reference signal.

In addition to modulation of the system wide reference signal with frequency dither information, it is possible, particularly in a local area network, to use a multiple or sub multiple of the local 60 Hz power supply to vary the frequency of the system wide reference signal and to provide the phase reference signal at the terminal devices TD. This latter arrangement would eliminate the need for modulation of the system wide reference signal and the attendant components.

The present invention advantageously provides a frequency multiplexed optical communications system in which a system wide reference source serves to stabilize all resonant devices in the system and in which different communications channels can be obtained by changing the resonant characteristics of the bus tap resonators to support various sets of resonant modes, such changes occurring in a repeatable step-wise manner.

Thus, it will be appreciated from the above that as a result of the present invention, a highly effective frequency multiplexed optical communications system is provided by which the principal objective, among others, is completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims.

What is claimed is:

1. An optical communications system comprising:
   an optical communications bus for propagating light signals;
   at least two terminal devices coupled to said bus for communication with one another; and
   means for introducing a light signal having a predetermined reference wavelength into said bus, said terminal devices including transmission means for generating communication channels fixed in wavelength relative to the predetermined reference wavelength and for introducing information bearing light signals into said bus at the wavelength of at least one of said communication channels.

2. The optical communications system of claim 1, wherein said optical communication bus comprises an optical fiber.

3. The optical communications system of claim 1, wherein said optical bus is configured as a closed loop.

4. The optical communications system of claim 1, wherein said terminal devices each comprise:
   resonant cavity means coupled to said optical bus for supporting a set of resonant modes.

5. The optical communications system of claim 4, wherein said resonant cavity means comprises a resonant cavity loop laterally coupled to said optical bus.

6. The optical communications system of claim 5, wherein said resonant cavity means comprises coupled first and second resonant cavity loops, one of said loops supporting a first set of resonant modes and the other resonant cavity loop supporting a second set of resonant modes, at least two modes of said first and second sets existing at the same wavelength.

7. The optical communications system of claim 6, further comprising:
   means for conrolling said first and second resonant cavity loops by thermally altering the effective optical length of said first and second cavity loops to support selected first and second sets of resonant modes.

8. The optical communications system of claim 4, further comprising:
   means for controlling said resonant cavity means to support a selected set of a plurality of sets of resonant modes with one mode of the selected set corresponding in wavelength to the predetermined reference wavelength.

9. The optical communications system of claim 8, wherein said means for controlling controls said resonant cavity means by altering a physical characteristic thereof.

10. The optical communications system of claim 9, wherein said means for controlling controls said resonant cavity means by thermally altering the effective optical length of the cavity to support different sets of resonant modes.

11. The optical communications system of claim 8, wherein said means for controlling comprises:
    means for detecting the presence of the predetermined reference wavelengths in said resonant cavity means; and
    means for tuning said resonant cavity means in a manner responsive to said means for detecting for thermally altering the effective optical length of said resonant cavity means to lock one mode of the supported set of resonant modes to the predetermined reference wavelength.

12. The optical communications system of claim 11, wherein said predetermined reference wavelength is varied about an average value and wherein the amplitude of the reference wavelength light signal varies in a fixed relationship with the variation in wavelength about the average value.

13. The optical communication system of claim 12, wherein said means for tuning further comprises:
    means for decoding the signal component that varies in a fixed relationship with the variation in wavelength about the average value to center lock one mode of the supported set of resonant modes to the predetermined reference wavelength.

14. The optical communications system of claim 4, wherein said transmission means comprises:
    a laser for introducing a light signal into said resonant cavity means; and
    laser wavelength control means for controlling the wavelength of the output of said laser in accordance with the frequency of a selected mode of the set of supported modes.

15. The optical communications system of claim 14, wherein said laser wavelength control means comprises:
    means for thermally altering the resonant characteristics of said laser.

16. The optical communications system of claim 15, wherein said laser wavelength control means comprise:
    means for altering the drive current to said laser to alter its wavelength to center lock to a selected mode of the set of supported modes.

17. The optical communications system of claim 14, wherein at least one of said terminal devices comprises:
    means for modulating the light signal output of said laser in advance of said resonant cavity.

18. The optical communications system of claim 1, wherein said means for introducing a predetermined reference wavelength comprises:
    resonant cavity means for supporting a set of resonant modes;

a fixed wavelength light source providing a light signal to said resonant cavity;

means for controlling said resonant cavity means to tune one resonant mode thereof to the wavelength of said fixed wavelength light source;

a laser light source for introducing light at a predetermined reference wavelength into said bus; and means for controlling said laser light source to tune said laser light source to another resonant mode of said resonant cavity means corresponding to said predetermined reference wavelength.

19. The optical communications system of claim 18, wherein said means for controlling said laser light source varies the wavelength of said laser light source in a periodic manner about the predetermined reference wavelength.

20. The optical communications system of claim 19, wherein said means for controlling said laser light source provides a signal component to the predetermined reference wavelength that varies in fixed relationship to the variation of the wavelength of said light source.

21. An optical communications system comprising:
an optical bus for propagating light signals;
means for introducing into said bus a light signal at a predetermined reference wavelength;
at least two terminal devices coupled to said bus, each terminal device including resonant cavity means for supporting plural sets of resonant modes one at a time and means for controlling said resonant cavity means to support a selected one of the plural sets of resonant modes and wherein one mode of each of the supported sets of resonant modes supports a light signal corresponding in wavelength to said predetermined reference light signal wavelength, said at least two terminal devices exchange optical signals by controlling their respective resonant cavity means to support the same set of resonant modes with the same resonant mode of said set of resonant modes corresponding in wavelength to the predetermined reference wavelength and one of said terminal devices introducing an information bearing signal into said bus at a wavelength corresponding to one of the resonant modes of the commonly supported set of resonant modes for removal by the other of said terminal devices.

22. The optical communications system of claim 21, wherein each of said terminal devices comprises:
means for introducing information bearing optical energy at wavelengths corresponding in wavelength to light signals supported by a resonant mode of said selected set other than said one mode supporting light signals corresponding in wavelength to the predetermined reference wavelength.

23. The optical communications system of claim 21, wherein each of said terminal devices comprises:
means for removing information bearing optical energy at wavelengths corresponding in wavelength to the light signals supported by the resonant modes of said selected set.

24. The optical communications system of claim 21, wherein said means for controlling the resonant cavity means of each terminal device further comprises:
means for driving said means for controlling the resonant cavity means to adjust the resonant characteristics of said resonant cavity so as to in effect center lock one mode of the supported set of modes to said predetermined reference wavelength.

25. The optical communications system of claim 21, wherein each of said terminal devices comprise:

a resonant cavity structure coupled to said bus and controllable to support plural sets of resonant modes;

means for controlling said resonant cavity structure to support a selected set of resonant modes with one mode of the supported set corresponding in wavelength to the predetermined reference wavelength.

26. The optical communications system of claim 21, wherein said means for introducing a predetermined reference wavelength into said bus comprises:
a resonant cavity structure for supporting a set of resonant modes, one of the supported modes corresponding in wavelength to the predetermined reference wavelength;
a first optical source for introducing optical energy into said resonant cavity structure at a wavelength corresponding to another one of the modes supported in said resonant cavity structure, said other mode offset in wavelength from said predetermined reference wavelength;
a second optical source for introducing optical energy into said resonant cavity structure at said predetermined reference wavelength;
control means for controlling said resonant cavity structure to lock the one resonant mode to the wavelength introduced by said first optical source and to control the second optical source to lock to the other resonant mode corresponding to the predetermined reference wavelength.

27. The optical communications system of claim 26, wherein said control means comprises:
a first control loop for controlling said resonant cavity structure to lock the one resonant mode to the wavelength introduced by said first optical source; and
a second control loop for controlling said second optical source to wavelength lock to the other resonant mode corresponding to the predetermined reference wavelength.

28. The optical communications system of claim 21, wherein said optical bus is configured as a closed loop.

29. A method of conveying light signals between terminal devices coupled to an optical communications bus in which each terminal device includes a controllable resonant cavity structure, the method comprising the steps of:
introducing an optical signal having a reference wavelength into the optical bus;
controlling the resonant cavities of at least two terminal devices to support the same set of resonant modes, the same resonant mode in each set of resonant modes having integral wavelengths of the reference wavelength; and
transmitting an information bearing light signal from one terminal device to the other at a wavelength corresponding to another resonant mode of the set of resonant modes.

30. The method of claim 29, further comprising the step of:
varying the wavelength of the introduced reference wavelength in a predetermined manner about an average value.

31. The method of claim 30, further comprising the step of:
controlling the resonant characteristics of the resonant cavity to in effect center lock the same resonant mode in each set of resonant modes to the reference wavelength.

* * * * *